United States Patent [19]

Shore

[11] Patent Number: 5,742,902
[45] Date of Patent: Apr. 21, 1998

[54] SUPER-REGENERATIVE CIRCUIT APPARATUS FOR A DOOR OPERATOR RECEIVER AND DOOR OPERATOR INCORPORATING THE SAME

[75] Inventor: Jerry Lynn Shore, Alliance, Ohio

[73] Assignee: GMI Holdings, Inc., Alliance, Ohio

[21] Appl. No.: 622,853

[22] Filed: Mar. 29, 1996

[51] Int. Cl.$^6$ ................................................. H04B 1/16
[52] U.S. Cl. ................ 455/336; 340/825.69; 340/825.72
[58] Field of Search ....................... 455/336; 340/825.69, 340/825.72, 825.31; 70/278

[56] References Cited

U.S. PATENT DOCUMENTS

| | | | |
|---|---|---|---|
| 3,359,240 | 12/1967 | Deming | 343/228 |
| 3,631,498 | 12/1971 | Bachhuber, Jr. | 343/228 |
| 3,746,999 | 7/1973 | Freen | 325/429 |
| 3,883,809 | 5/1975 | Ver Planck et al. | 325/429 |
| 4,143,324 | 3/1979 | Davis | 325/429 |
| 4,307,465 | 12/1981 | Geller | 375/76 |
| 4,383,242 | 5/1983 | Sassover et al. | 340/64 |
| 4,393,514 | 7/1983 | Minakuchi et al. | 455/336 |
| 4,398,283 | 8/1983 | Pottier | 370/30 |
| 4,455,682 | 6/1984 | Masters | 455/300 |
| 4,921,466 | 5/1990 | Matsumoto et al. | 455/214 |
| 5,105,162 | 4/1992 | Fleissner et al. | 329/359 |

OTHER PUBLICATIONS

Figure A showing preamplifier circuit on sale more than one year before the filing date of this application.
Figure B showing preamplifier circuit on sale more than one year before the filing date of this application.

*Primary Examiner*—Andrew Faile
*Assistant Examiner*—Christopher Onuaku
*Attorney, Agent, or Firm*—Beveridge, DeGrandi, Weilacher & Young, L.L.P.

[57] ABSTRACT

A door operator includes a low noise, low radiation emission but high sensitivity super-regenerative receiver. The low radiation emission of the receiver allows the installation of plural operators in close proximity. The door operator receiver includes a super-regenerative circuit apparatus with a super-regenerative circuit and a resistively loaded cascode preamplifier stage that phase shifts a received RF signal and tightly couples the preamplifier stage output to the super-regenerative circuit. A cascode circuit arrangement of a field effect transistor (FET) and a bipolar transistor provides forward gain and very high reverse direction gain or isolation for the preamplifier stage. Preferably, the resistive loading elements and the phase-shifting elements are coupled to the cascode circuit between the transistors. The present invention also relates to a cascode preamplifier stage, a super-regenerative circuit, and a RF receiver each including such a preamplifier stage.

30 Claims, 4 Drawing Sheets

1 U FS  1. 61.328 Ω  -91.332 Ω  4.4682 pF
390.000 000 MHz

START 200.000 000 MHz    STOP 440.000 000 MHz

1 U FS  1: 6.4961 Ω  -73.27 Ω  5.5697 pF
390.000 000 MHz

MARKER 1
390 MHz

START 200.000 000 MHz    STOP 440.000 000 MHz

SUPER-REGENERATIVE CIRCUIT APPARATUS FOR A DOOR OPERATOR RECEIVER AND DOOR OPERATOR INCORPORATING THE SAME

BACKGROUND OF THE INVENTION

The present invention relates to super-regenerative receivers in garage door openers or "operators". More specifically, the present invention relates to a cascode preamplification circuit stage for a super-regenerative circuit, a RF receiver equipped with such a cascode preamplifier stage in combination with a super-regenerative circuit, and a garage door opener including a such receiver.

Electrical garage door openers include radio frequency (RF) receivers to receive control signals from a remote RF transmitter, namely a hand-held transmitter typically kept within the homeowner's car. A type of radio receiver, hereinafter referred to as a super-regenerative receiver, is, from a cost standpoint, very attractive for use in garage door openers. The cost of manufacture for such receivers may be about half of that for crystal oscillator-based receivers. However, without expensive shielding, super-regenerative receivers are electrically noisy.

U.S. Pat. No. 3,746,999 discusses examples of the electrical noise that is attributed to this type of receiver. This patent comments on noise resulting from the generation of quench oscillations that are developed to release and inhibit a regenerative circuit, and goes on to set forth problems that arise as a result of the quench oscillations such as interaction with local oscillations in the proximity of the receiver. Other examples of noise problems in super-regenerative receivers are radiation of the superimposed tuning and quench frequencies, and also other unwanted emission at different frequencies.

In garage door openers, interaction between conventional super-regenerative receivers becomes very problematic where two or more such openers are employed in close proximity, for example at the same site. Typically, garage door opener receivers are manufactured to operate at the same frequency. Thus, where multiple such operators are employed at the same site, it is not unlikely that one receiver will lock on to the quench oscillations of another receiver and then ignore the radio frequency signal from its associated hand-held transmitter. As such, the receiver locked onto the quench oscillation will not respond to operator commands issued by way of the hand-held transmitter. At minimum, such conditions limit the effective range of the hand-held transmitter from the receiver. At worst, they result in a lock-up or non-responsiveness by one or more receiver.

SUMMARY OF THE INVENTION

The present invention pertains to a cascode preamplifier stage for a super-regenerative circuit, a super-regenerative apparatus including such a preamplifier stage in combination with a RF super-regenerative circuit, a super-regenerative receiver equipped with such a super-regenerative circuit apparatus, and a garage door opener including such a super-regenerative receiver. This results in a reliable garage door operator that has high sensitivity with low noise and features very low unwanted RF output radiation. The super-regenerative receiver, according to the present invention, overcomes interference problems in conventional super-regenerative receiver based door operators due to oscillation radiation when plural conventional door operators are installed at close proximity. The present invention accomplishes this goal without significantly increasing the cost of the super-regenerative receiver, thus providing a receiver that is attractive for use in a garage door operator, to minimize the cost of the operator.

The present invention relies upon a cascode preamplifier stage that cooperates with a regenerative circuit stage to minimize the amount of RF radiation emitted by a receiver that includes these stages. At the same time, the preamplifier stage increases sensitivity for the super-regenerative circuit. The preferred cascode preamplifier stage has low noise, forward gain characteristics and also very high reverse isolation. It has a low input impedance at its coupling with the super-regenerative circuit stage to highly couple these stages and reduce noise transferred therebetween. The preferred cascode preamplifier stage itself features a cascade dual-gate field effect transistor (FET) and bipolar transistor arrangement that is resistively loaded to ensure stable amplification. Preferably, the FET and bipolar arrangement also includes a phase shifting arrangement, to phase shift an antenna signal carried forward to further enhance stability while protecting the resultant receiver and door operator from generating unintended oscillation. More preferably, the resistive loading device cooperates with the phase shifter to enhance phase shift within the preamplifier stage.

Briefly, a radio frequency (RF) controlled door operator responsive to RF signals from an associated remote RF transmitter in accordance with the present invention comprises: a motor for opening and closing a door; a super-regenerative receiver for recovering a data signal from a received RF signal, the receiver including a super-regenerative circuit with an input and an output; a cascode preamplifier stage connected to the input of the super-regenerative circuit for amplifying a received RF signal to provide an amplified signal and applying its amplified signal to the super-regenerative circuit, the preamplifier stage including a field effect transistor (FET) and a bipolar transistor connecting the FET to the super-regenerative circuit, the FET and the bipolar transistor cooperating to produce low gain in a direction from the input of the super-regenerative circuit to an input of the preamplifier stage, data amplifier means having an input connected to the output of the super-regenerative circuit for recovering a data signal from an output signal from the super-regenerative receiver circuit, and decoder means connected to the data amplifier means for decoding a data signal applied thereto by the data amplifier means and generating a decoded control signal therefrom; and control means, responsive to a decoded control signal from the decoder means, for controlling the motor.

BRIEF DESCRIPTION OF THE DRAWINGS

Further aspects and features of the present invention will be even more apparent from the following detailed description and drawings, and the appended claims. In the drawings:

DETAILED DESCRIPTION OF THE PREFERRED EMBODIMENTS

Figure 1:
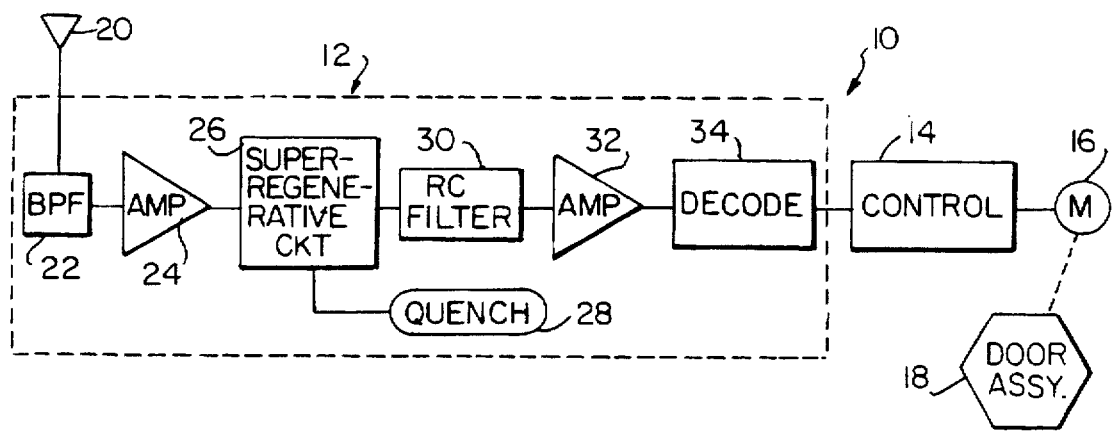
FIG. 1 is a block diagram showing a preferred garage door operator in accordance with the present invention.

FIG. 1 shows a garage door operator 10 equipped with a cascode preamplifier, in a super-regenerative receiver, in accordance with the present invention. Door operator 10 is shown in block diagram form. Herein, particular attention will be given to the super-regenerative receiver 12 which detects and decodes control signals that are applied by the receiver to a control system 14 which controls a motor 16 to open and close a garage door, gate, or like assembly 18.

Preferred super-regenerative receiver 12 is contemplated to receive at a 390 Mhz carrier frequency and is tuned thereto. It detects a single frequency (390 Mhz), continuous wave (CW) signal that is on-and-off modulated to superimpose a data signal on the 390 MHz carrier wave to produce a RF command signal. The quench frequency of receiver 12 is about 1 Mhz.

Preferred receiver 12 is coupled to an antenna 20 that is connected to a band pass filter 22 in the receiver. Output from the band pass filter 22 is applied as input to the cascode preamplifier stage 24. Output from the cascode preamplifier 24 is coupled to a super-regenerative circuit 26 that includes a quench oscillator 28. Super-regenerative circuit 26 retrieves the RF command signal and applies the retrieved command signal, with the quench signal also superimposed thereon, as low level input to a RC filter 30. In the preferred form of receiver 12, and door operator 10, filter 30 cooperates with a data amplifier 32 which together filter both the carrier frequency and the quench frequency, amplify and further process the filtered signal to recover the data signal prior to providing the data signal to a decoder 34. Decoder 34 receives the amplified data signal as input, decodes it, and supplies decoded control signals to the controller 14 which controls motor 16 and the door equipment 18 accordingly.

Figure 2:
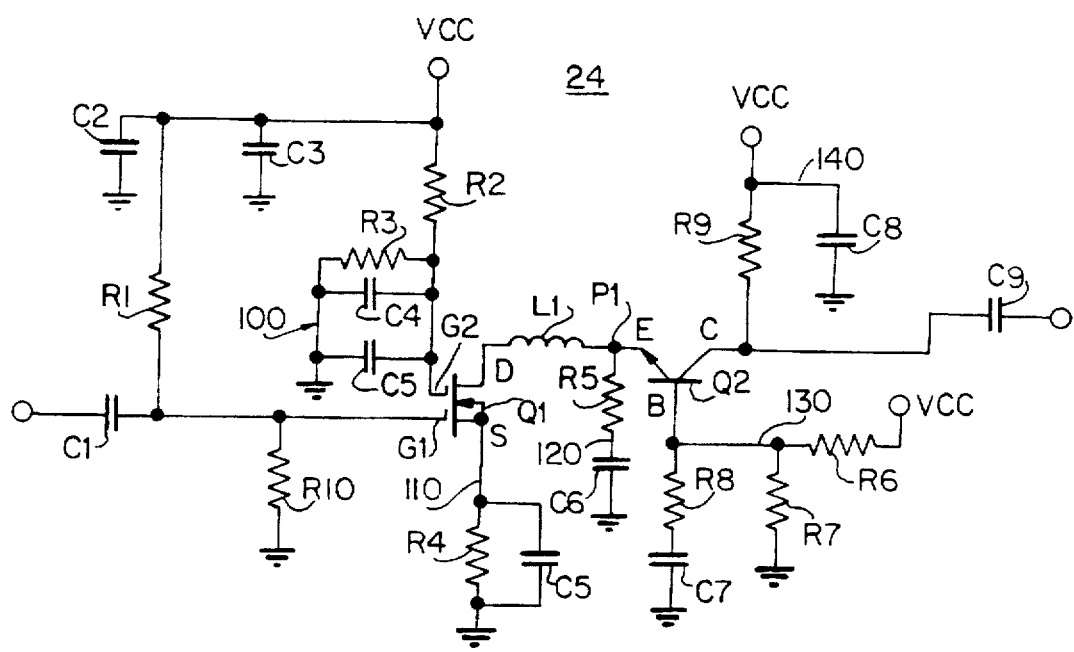
FIG. 2 is a circuit diagram showing details of the cascode preamplifier stage of the garage door operator of FIG. 1.

FIG. 2 is a circuit diagram of cascode preamplifier stage 24. The heart of cascode preamplifier 24 is a dual gate FET Q1 and a bipolar transistor Q2. A 33 nH inductor L1 connects the drain D of FET Q1 to the emitter leg E of bipolar transistor Q2. Inductor L1 provides phase adjustment for the cascade connection of FET Q1 and bipolar transistor Q2.

Cascode preamplifier stage 24 receives filtered RF command signal input from antenna 20 through a 1.2 pF capacitor C1 located at the output of band pass filter 22 and the input of the cascode preamplifier. Capacitor C1 is transparent to RF input from filter 22 but blocks DC voltage therefrom. The RF command signal passed by capacitor C1 is applied to gate G1 of FET Q1. A voltage divider formed by a 470K resistor R1 and a 22k resistor R10 provides DC bias for gate G1 at about 0.5 VDC. A 3.9 pF capacitor C2 and a 33 pF capacitor C3 short AC voltage over R1 to ground prior to contact with the power supply.

The other gate of FET Q1, namely gate G2, receives a DC bias voltage of about 2.7 VDC by way of its connection to a DC gain set control circuit 100. Circuit 100 connects to supply power through capacitor C2 and a 75K resistor R2. Circuit 100 includes the parallel arrangement of a 22K resistor R3, a 3.9 pF capacitor C4 and a 33 pF capacitor C5, all connected between a line to gate G2 and ground. The circuit 100 including resistor R3, capacitor C4, and capacitor C5 strips AC components from the DC bias voltage applied to gate G2.

Next, note the source S of FET Q1. Source S is connected to a DC feedback and stability network 110. In preferred cascode stage 24, network 110 consists of a 10 Ω resistor R4 and a 33 pF C5 connected in parallel between the source S and ground.

Preferred cascode preamplifier 24 includes a resistive loading network 120 connected in parallel with inductor L1 to the emitter E of transistor Q2 at a connection point P1. Network 120 includes a series connection of a 200 Ω resistor R5, from connective point P1, and a 33 pF capacitor C6 connected between resistor R5 and ground. Network 120 stabilizes the cascading connection of FET Q1 and transistor Q2. It also reduces the intensity of the 390 MHz spectrum emitted by receiver 12. Network 120 further cooperates with inductor L1 to phase shift the RF command signal forward. Likewise, inductor L1 further contributes to stability provided primarily by network 120. Given this disclosure, those of ordinary skill in the art also will note that in some applications, a 0.5 pF capacitor, connected to inductor L1 (prior to connection point P1) and to ground can be used.

With particular focus now on bipolar transistor Q2, the base B of transistor Q2 is supplied with DC bias by bias circuit 130. Power supply voltage is applied to the base of transistor Q2 through a 5.6K resistor R6 and thereafter a network of an 11K resistor R7, in parallel with a 10 Ω resistor R8, and a 33 pF capacitor C7 in series with R8. Bias circuit 130 applies a DC bias of about 6.7 VDC to the base B of transistor Q2.

Another gain network 140, that also contributes to stability in preamplifier 24, is connected to the collector C of transistor Q2, upstream of the output of cascode preamplifier stage 24. Network 140 is seen to include a parallel connection of a 200 Ω resistor R9 and a 0.01 µF capacitor C8. In gain network 140, resistor R9 has a lower value than is normally found in such an arrangement. At its output, cascode preamplifier 24 includes a 33 pF coupling capacitor C9. Capacitor C9 likewise is transparent to RF but blocks DC voltage. As such, coupling capacitor C9 prevents noise and DC from being applied to the super-regenerative circuit 26 connected to the preamplifier output.

In preferred cascode stage 24, FET Q1 acts as a low noise amplifier. The FET Q1 has low reverse gain, i.e. high isolation from the output of preamplifier stage 24, at capacitor C9, to the input thereof at capacitor C1. Such low noise and high isolation characteristics act to limit oscillation that otherwise would be radiated by receiver 12. Bipolar transistor Q2, arranged in common base configuration, further increases the isolation attributes of FET Q1. The parallel connection of inductor L1, and network 120 consisting of resistor R5 and capacitor C6 both add to the stability of the resulting super-regenerative receiver 12 by resistive loading, and provide for phase adjustment. Resistor R5 and capacitor C6 primarily provide the resistive loading that increases stability and decreases emission of 390 MHz oscillation. Inductor L1 primarily advances the phase of the RF signal but resistor R5 and capacitor C6 also contribute to phase control. In the configuration of preferred preamplifier stage 24, bipolar transistor Q2, in addition to providing further isolation, also contributes to lowering the noise factor for the super-regenerative circuit by providing gain. Resistor R9, by virtue of its low value, further contributes to the stability of the receiver. These components, in cooperation with the high value of output capacitor C9, heavily couple preamplifier stage 24 to super-regenerative circuit stage 26 to reduce noise within the receiver 12.

Figure 3A:
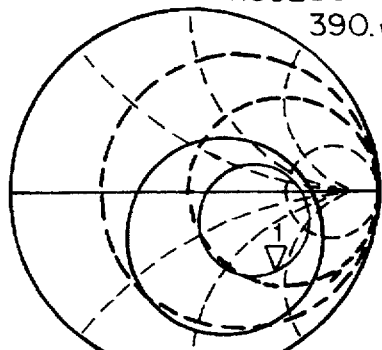
FIG. 3A is a Smith diagram illustrating input impedance characteristics looking through the cascode preamplifier stage of FIG. 2 from the antenna of the door operator of FIG. 1 to the output of the preamplifier stage.
Figure 3B:
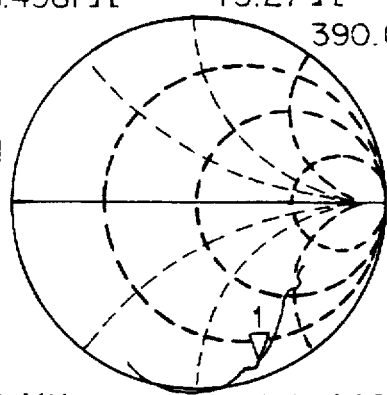
FIG. 3B is a diagram, similar to FIG. 3A, showing the impedance characteristics looking backwardly through the cascode preamplifier from the output thereof back to the antenna.
Figure 4A:
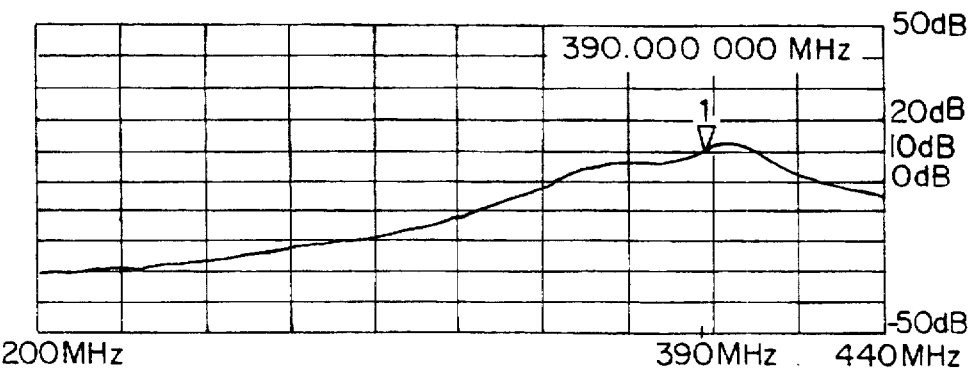
FIG. 4A is a linear frequency plot showing the forward gain through the cascode preamplifier stage of FIG. 2 with particular focus at the tuning frequency of the preferred super-regenerative circuit of FIG. 5.
Figure 4B:
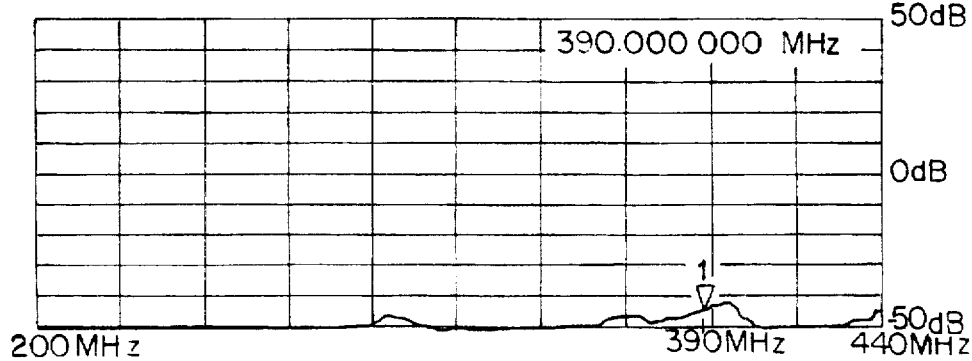
FIG. 4B is a plot similar to FIG. 4A of the reverse gain or isolation of the cascode preamplifier stage of FIG. 2.

Reference now is made to FIGS. 3A through 4B. FIG. 3A is a Smith chart showing the impedance characteristics of a commercial form of cascode preamplifier stage 24 as seen from the antenna terminal. As apparent from FIG. 3A, the impedance, $z_f$ as seen from the antenna terminal generally is given by $z_f = (61-j91)$. On the other hand, FIG. 3B shows the impedance characteristics of the same commercial embodiment of preamplifier 24 looking upstream of the amplifier from its output at coupling capacitor C9. The impedance, $z_r$, shown by the Smith chart of FIG. 3B generally is given by $z_r = (6-j72)$. As appreciated by those of ordinary skill in the art, these impedance measurements may differ. FIG. 4A and FIG. 4B illustrate the forward and reverse gain respectively through the commercial form of preferred cascode preamplifier 24. As seen from FIG. 4A, the forward gain at 390 MHz is about 9.7 db. As seen from FIG. 4B, the reverse gain or isolation of cascode preamplifier 24 at 390 MHz is about −43.97 db.

From the disclosure hereof, alternative configurations will become apparent to those of ordinary skill in the art. For instance, a DC block by means of a drain load resistor, or an inductor for drain bias, could be provided between FET Q1 and bipolar transistor Q2. Further, if it were desired to remove the ground plane from the circuit board on which preamplifier 24 is mounted, a parallel capacitor could be placed across inductor L1, to compensate for the ground plane removal. Also, an inductor or a transformer could be used to bias bipolar transistor Q2. Further, somewhat lower capacitance values for capacitor C9 also could be acceptable. The range of capacitance values for capacitor C9 could be from about 10 pF to about 50 pF and still maintain high coupling between the preamplifier 24 and the super-regenerative circuit 26.

Figure 5:
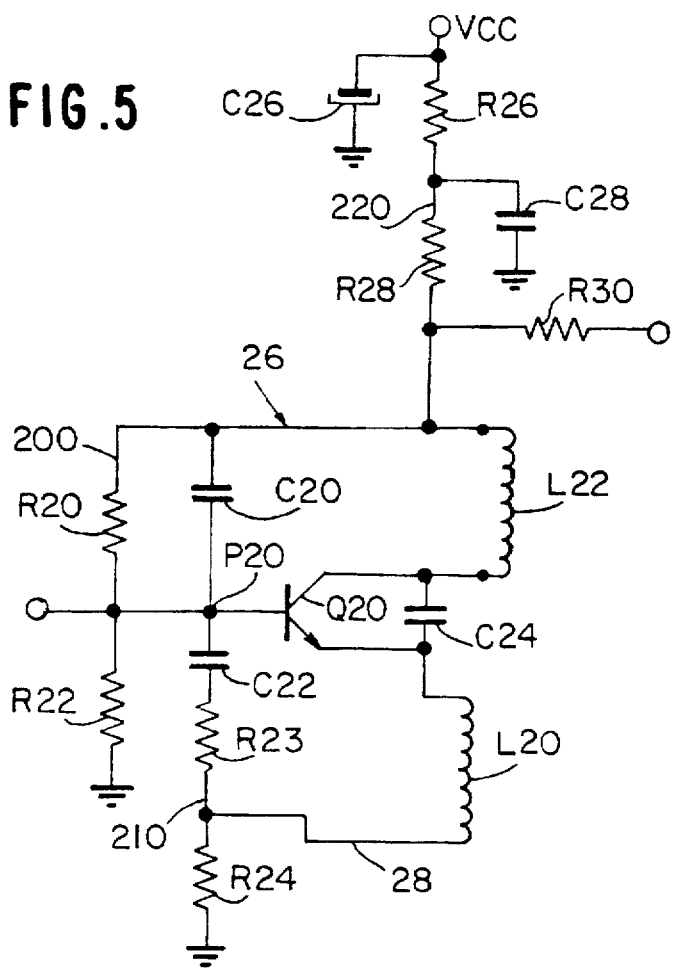
FIG. 5 is a schematic diagram showing the preferred super-regenerative circuit ideally suitable for use in the garage door operator of FIG. 1.
Figure 6:
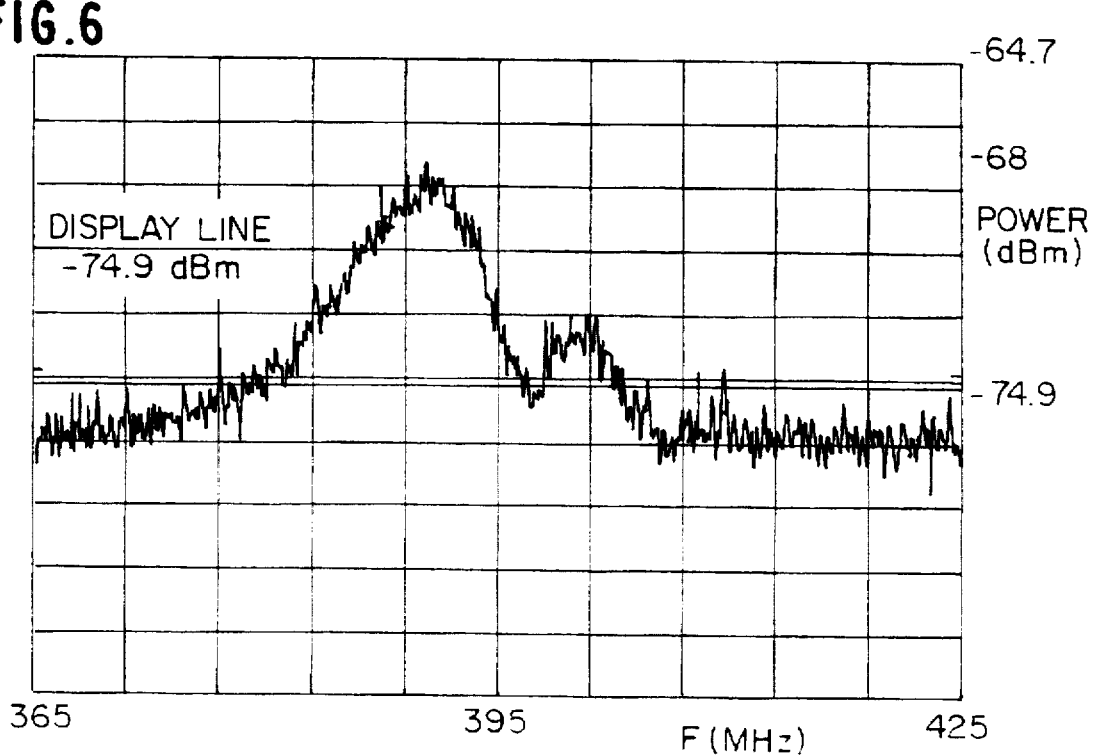
FIG. 6 is a logarithmic amplitude plot of radiation output of the super-regenerative receiver of FIG. 5 when fed by the cascode preamplifier stage of FIG. 2.

Next, consideration is made of the super-regenerative circuit 26 and its accompanying quench voltage oscillator 28. Super-regenerative circuit 26 can be conventional. However, a preferred form of a super-regenerative circuit is disclosed herein and is ideally suited for use in preferred receiver 12 because of its tight coupling and cooperation with cascode preamplifier stage 24. Such preferred super-regenerative circuit 26 and quench voltage oscillator 28 are shown at the component level in FIG. 5. The super-regenerative circuit and quench oscillator of FIG. 5, when used in connection with preferred cascode preamplifier stage 24, display the reduced oscillation radiation output level such as shown in FIG. 6.

Preferred super-regenerative circuit 26 connects to coupling capacitor C9 through a voltage divider 200. Voltage divider 200 includes a 24K resistor R20 and a 4.7K resistor R22. Resistor R20 also is connected in parallel with a 100 pF bypass capacitor C20. A connective point P20 connects voltage divider 200, bypass capacitor C20, and the quench oscillator 28 to the base of bipolar transistor Q20.

As stated, preferred quench oscillator 28 oscillates at about 1 MHz, which oscillation primarily is set by the 220 nH inductor L20 connected between the base and the emitter of transistor Q20. One terminal of inductor L20 is connected to the emitter of transistor Q20. The other terminal of inductor L20 is connected to a voltage divider 210 provided by 300 Ω resistor R23 and a 470 Ω resistor R24. A 220 pF capacitor C22 connects resistor R22 to the connective point P20 and thus to the base of transistor Q20.

Capacitor C22, resistors R23, R24, and inductor L20 determine the quench frequency of oscillator 28. Values of capacitor C22, resistors R23, R24, and inductor L20 are selected to lower the noise figure of receiver 12, and to tune the frequency where receiver is sensitive to be close to the null in its radiated spectrum.

Bypass capacitor C20, a 1 pF capacitor C24, and an inductor L22 tune super-regenerative circuit 26 for operation at 390 MHz. In a preferred form of super-regenerative circuit 26, inductor L22 can have a value within a range of about 52 nH to about 63 nH. In practice, as will be appreciated by those of ordinary skill in the art, the tuned or operation frequency of circuit 26 will be set by the inductor L22, the stray capacitance thereof, and the collector capacitance of transistor Q20. Capacitor C24 arranges transistor Q20 in common base configuration.

A small signal recovery network 220 connects between a terminal of inductor L22 and bypass capacitor C20. Network 220 includes a 22 μF filtering capacitor C26 to decouple the quench oscillations from the system power supply. Resistor R26, connected in parallel with capacitor C26, is a 4.7K load resistor. A 33 pF capacitor C28 is connected to the other side of resistor R26 and shorts RF to ground. Signal recovery is developed over an 18K recovery resistor R28, from which the recovered RF command signal, together with the quench oscillation, are output on the 3.6K output resistor R30. The other side of output resistor R30 connects to the input of the RC filter 30 for the regenerative circuit 26.

Figure 7:
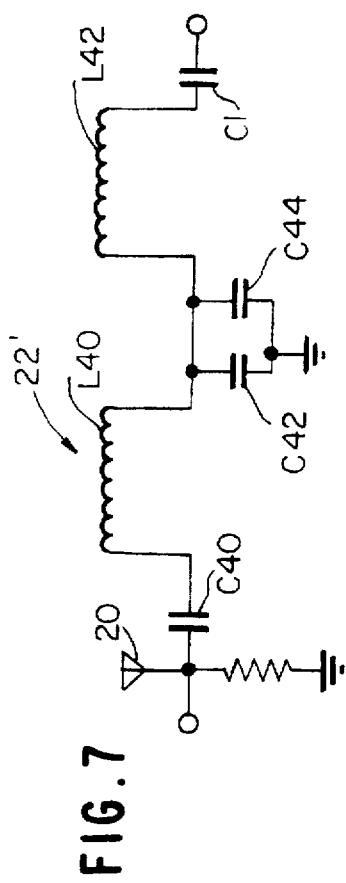
FIG. 7 is a circuit diagram of a five-pole bandpass filter suitable for use in the garage door operator and super-regenerative circuit apparatus in accordance with the present invention.

FIG. 7 shows a preferred form of a bandpass filter 22' suitable for use as filter 22 in the present invention. As seen from FIG. 7, preferred bandpass filter 22' includes a 1.5 pF capacitor C40 located between the antenna 20 and a first inductor L40. Inductor L40 can be in the range of about 68 nH to about 86 nH. It, in turn, is connected to a second inductor L42, which in turn connects to the input capacitor C1 of cascode preamplifier stage 24. Inductor L42 can have a value in the range of about 88 nH to about 110 nH. Connected in parallel between inductors L40 and L42 is a parallel network provided by a 12 pF capacitor C42 and a 3.3 pF capacitor C44, connected between the inductors L40 and L42 and ground. Capacitor C40, inductor L40, capacitor C42, capacitor C44, inductor L42, and also capacitor C1, provide a five-pole bandpass filter and impedance matching network for receiver 12. Preferred filter 22' transforms the impedance of antenna 20 to provide low noise matching with the FET Q1 of preamplifier stage 24. This provides suitable protection to the receiver 12 from signals outside of the receivers' band width. Alternatively, as also will be appreciated by those of ordinary skill in the art, different bandpass filter arrangements, with, for example, a lesser number of poles, could be substituted for filter 22' without detracting from the operation of the present invention.

Figure 8:
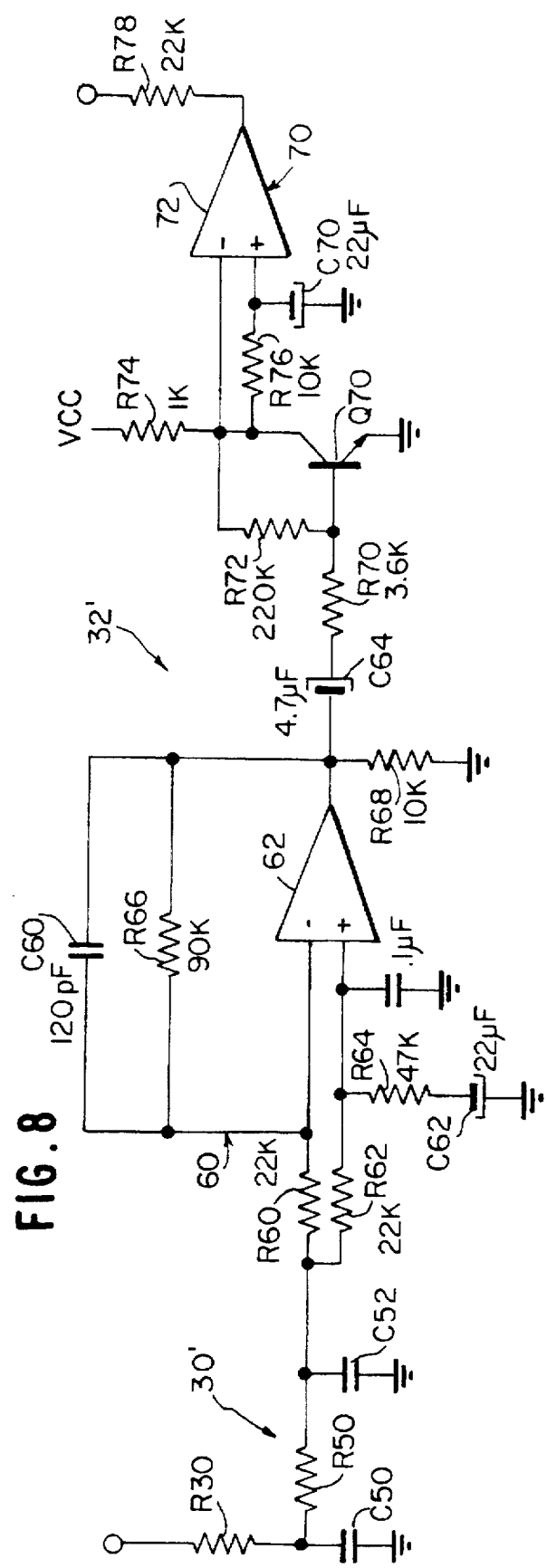
FIG. 8 is a circuit diagram of a RC filter stage and a data amplifier stage suitable for use with the garage door operator and super-regenerative circuit apparatus in accordance with the present invention.

A preferred version of RC filter 30 and data signal amplifier 32 is shown in FIG. 8 and labelled as filter 30' and data signal amplifier 32' respectively. As seen from FIG. 8, resistor R30 at the output of super-regenerative circuit 26 also forms part of the RC filter 30'. Filter 30' includes resistor R30, a 2.2K resistor R50 connected to resistor R30, and a 100 pF capacitor C50 connected in parallel therebetween. On the other side of resistor R50, a 0.0068 µF capacitor C52 connects between resistor R50 and ground. Resistor R30, capacitor C50, and resistor R50 cooperate to filter the carrier frequency component from the low level superimposed RF command and quench signals recovered by resistor R28 of super-regenerative circuit 26. Resistor R50 and capacitor C52 filter the quench oscillation to provide a filtered signal.

Preferred data amplifier 32' includes a first substage 60 defined by operational amplifier 62, and a second substage 70 including a bipolar transistor Q70 and a second operational amplifier 72. The first substage 60 squares the filtered signal applied to it from the RC filter 30' by provision of a longer time constant on the non-inverting input to operational amplifier 62. In the second substage 70, transistor Q70 further amplifies the squared signal. The open loop configuration of the second substage 70, including operational amplifier 72, further shapes the squared signal byway of the time constant difference between the inputs of amplifier 72. As also seen from FIG. 8, substage 60 includes several other discreet components, namely resistors R60, R62, R64, R66, and capacitors C60, C62 and C64 that are not discussed in detail herein. The values of the components, however, are given in FIG. 8. The same is done for substage 70 and its discreet components R70, R72, R74, R76, and R78, and capacitor C70.

As noted in the foregoing, FIGS. 7 and 8 merely show well suited filter and data amplifier arrangements for use in connection with the present invention. However, as will be apparent to those of ordinary skill in the art, other alternatives to these arrangements can be provided.

The operation of preferred receiver 12 now will be described with reference to preamplifier 24 and the other preferred elements discussed hereinbefore. Five pole bandpass filter 22' filters noise and other out-of-band signals to apply a received 390 MHz, CW modulated command signal to preamplifier stage 24 from antenna 20. Filter 22' is configured to provide a good impedance match to FET Q1 of preamplifier 24.

Preamplifier stage transistors Q1 and Q2 provide low-noise amplification of the filtered signal from filter 22' prior to coupling the signal to super-regenerative circuit 26. This permits a high degree of signal transfer to the super-regenerative stage 26 without dampening oscillation in the super-regenerative stage. While preamplifier stage 24 has high gain in the forward direction, FET Q1 and the common base configuration of transistor Q2 ensure very low gain or high isolation in the reverse direction from output to input. Transistors Q1 and Q2 and their associated resistive loading network 120 and phase shifting elements (inductor L1 and network 120) thus decouple super-regenerative circuit 26 and quench oscillator 28 from antenna 20, in the reverse direction, to limit the receiver's radiation at 390 MHz, and to prevent other undesired oscillation in the receiver. Specifically, resistive loading by resistor R5 and capacitor C6 contribute to reducing emission of the receiver's 390 MHz spectrum as well as lending stability to the combination of stages 24 and 26.

Capacitor C9 heavily couples an amplified (filtered) output signal to super-regenerative circuit 26. The high coupling factor improves the noise factor in receiver 12. When the output signal from cascode preamplifier stage 24 is coupled to super-regenerative circuit 26, the amplified signal alters the quench oscillation period and amplitude. This alters the collector current of transistor Q20 and creates gain in the super-regenerative circuit stage 26. Circuit 26 develops a modified command signal including the command signal with the quench oscillation superimposed thereon as a recovered signal across resistor R28, and couples the recovered signal to the filter 30' and data amplifier 32' stages over resistor R30. The recovered signal, as applied to filter 30', is present on capacitor C50. The recovered signal has a very low intensity level. In filter 30', resistor R30, capacitor C50 and resistor R50 filter the carrier frequency component from the recovered signal to provide a filtered recovered signal, still superimposed with the quench signal. Resistor R50 also forms the next filtering substage with capacitor C52 to filter the quench frequency from the filtered recovered signal. From here, operational amplifier 62 squares and level shifts the fully filtered signal to apply a level shifted signal to transistor Q7 which in turn provides for further amplification thereof. Transistor Q7 applies the amplified, level-shifted signal to operational amplifier 72 which shapes the level shifted signal, to provide the data signal as its output. Decoder 34 receives the recovered data signal from preferred data amplifier 32', decodes it and accordingly applies decoded control signals to controller 14.

The present disclosure includes subject matter defined in the appended claims, as well as that of the foregoing description and drawings. Although the present invention has been described in connection with preferred forms thereof, and therefore with a certain degree of particularity, it is to be understood that the present disclosure of the preferred forms is made only by way of example and that numerous changes in the details of construction, beyond those expressly described herein, may be made, and that changes in the combination and arrangement of parts may be made without departing from the spirit and the scope of the invention as hereinafter claimed.

What is claimed:

1. A super-regenerative circuit apparatus for a radio frequency (RF) controlled electrical garage door opener with a RF receiver, said apparatus comprising:

a super-regenerative circuit including a tuned circuit tuned to an operational frequency and a quench oscillator that periodically enables and inhibits said super-regenerative circuit according to a quench frequency, said super-regenerative circuit producing an output signal with said operational frequency and said quench frequency superimposed; and a cascode circuit connected to an input of said super-regenerative circuit as a preamplifier stage therefor, said cascode circuit including a field effect transistor (FET) and a bipolar transistor connecting said FET to said super-regenerative circuit, said FET and said bipolar transistor cooperating to produce very low gain in a direction from said input of said super-regenerative circuit to an input of said cascode circuit to thereby decrease RF radiation emitted from said super-regenerative circuit.

2. A super-regenerative circuit apparatus as claimed in claim 1, comprising:

resistive loading means connected to said FET and said bipolar transistor for increasing stability in said cascode circuit.

3. A super-regenerative circuit apparatus as claimed in claim 2, wherein said cascode circuit further comprises phase shifting means connected between said FET and said bipolar transistor, and said resistive loading means is connected in parallel with said phase shifting means, said resistive loading means cooperating with said phase shifting means to phase shift a signal amplified by said cascode circuit.

4. A super-regenerative circuit apparatus as claimed in claim 3, wherein said phase shifting means includes inductive means, and said resistive loading means includes a capacitive means and a resistive means connecting said capacitive means to said inductive means.

5. A super-regenerative circuit apparatus as claimed in claim 4, wherein said inductive means is an inductor that connects the drain of said FET to the emitter leg of said bipolar transistor, said capacitive means is a capacitor, said resistive means is a resistor that connects said capacitor to a connective point between said inductor and said emitter leg, and said bipolar transistor is connected in common base configuration.

6. A super-regenerative circuit apparatus as claimed in claim 4, further comprising large value coupling capacitance means connecting the collector leg of said bipolar transistor to said super-regenerative circuit.

7. A super-regenerative circuit apparatus as claimed in claim 6, wherein said coupling capacitance means has a capacitive value of about 33 pF.

8. A super-regenerative circuit apparatus as claimed in claim 6, including a gain network connected to said collector of said bipolar transistor, said gain network including a parallel connection of a resistor having a value of about 200 Ω and a capacitor.

9. A super-regenerative circuit apparatus as claimed in claim 2, wherein said FET is a dual gate FET having a first gate and a second gate, said cascode circuit includes a DC gain control circuit for said FET, and said first gate is connected to an input of said cascode circuit, and said second gate is connected to said DC gain control circuit.

10. A super-regenerative receiver for a radio frequency (RF) controlled electrical garage door, said receiver comprising:

a super-regenerative circuit including a tuned circuit tuned to an operational frequency and a quench oscillator that periodically enables and inhibits said super-regenerative circuit according to a quench frequency, said super-regenerative receiver producing an output signal with said operational frequency and said quench frequency superimposed;

a cascode circuit connected to an input of said super-regenerative circuit as a preamplifier stage therefor, said cascode circuit including a field effect transistor (FET) and a bipolar transistor connecting said FET to said super-regenerative circuit, said FET and said bipolar transistor cooperating to produce very low gain in a direction from said input of said super-regenerative circuit to an input of said cascode circuit to thereby decrease RF radiation emitted from said super-regenerative circuit; and a band pass filter connected to an input of said cascode circuit.

11. A super-regenerative receiver as claimed in claim 10, comprising:

resistive loading means connected to said FET and said bipolar transistor.

12. A super-regenerative receiver as claimed in claim 11, wherein said cascode circuit further comprises phase shifting means connected between said FET and said bipolar transistor, and said resistive loading means is connected in parallel with said phase shifting means, said resistive loading means cooperating with said phase shifting means to phase shift a signal amplified by said cascode circuit; and said bipolar transistor is connected in common base configuration.

13. A super-regenerative receiver as claimed in claim 12, further comprising large value coupling capacitance means connecting the collector leg of said bipolar transistor to said super-regenerative circuit.

14. A super-regenerative receiver as claimed in claim 13, including a gain network connected to said collector of said bipolar transistor, said gain network including a parallel connection of a resistor having a value of about 200 Ω and a capacitor, and wherein said FET is a dual gate FET having a first gate and a second gate, said cascode circuit includes a DC gain control circuit for said FET, and said first gate is connected to an input of said cascode circuit, and said second gate is connected to said DC gain control circuit.

15. A super-regenerative receiver as claimed in claim 12, further comprising a filter connected to receive an output signal from said super-regenerative circuit to provide a filtered signal;

a data amplifier for recovering a data signal from a filtered signal from said filter; and a decoder for detecting control codes in a data signal recovered by said data amplifier.

16. A radio frequency (RF) controlled door operator responsive to RF signals from an associated remote RF transmitter, said door operator comprising:

a motor for opening and closing a door;

a super-regenerative receiver for recovering a data signal from a received RF signal, said receiver including a super-regenerative circuit with an input and an output;

a cascode preamplifier stage connected to said input of said super-regenerative circuit for amplifying a received RF signal to provide an amplified signal and applying its amplified signal to said super-regenerative circuit, said preamplifier stage including a field effect transistor (FET) and a bipolar transistor connecting said FET to said super-regenerative circuit, said FET and said bipolar transistor cooperating to produce low gain in a direction from said input of said super-regenerative circuit to an input of said preamplifier stage, data amplifier means having an input connected to said output of said super-regenerative circuit for recovering a data signal from an output signal from said super-regenerative receiver circuit, and decoder means connected to said data amplifier means for decoding a data signal applied thereto by said data amplifier means and generating a decoded control signal therefrom; and control means, responsive to a decoded control signal from said decoder means, for controlling said motor.

17. A door operator as claimed in claim 16, comprising:

resistive loading means connected to said FET and said bipolar transistor.

18. A door operator as claimed in claim 17, wherein said cascode circuit further comprises phase shifting means connected between said FET and said bipolar transistor, said resistive loading means is connected in parallel with said phase shifting means, said resistive loading means cooperating with said phase shifting means to phase shift a signal amplified by said cascode circuit, and said bipolar transistor is connected in common base configuration.

19. A door operator as claimed in claim 18, further comprising large value coupling capacitance means connecting the collector leg of said bipolar transistor to said super-regenerative circuit.

20. A door operator as claimed in claim 19, including a gain network connected to said collector of said bipolar transistor, said gain network including a parallel connection of a resistor having a value of about 200 Ω and a capacitor, and wherein said FET is a dual gate FET having a first gate and a second gate, said cascode circuit includes a DC gain control circuit for said FET, and said first gate is connected to an input of said cascode circuit, and said second gate is connected to said DC gain control circuit.

21. A preamplifier stage for a super-regenerative circuit in a radio frequency (RF) receiver for use in an electrical door opener, said preamplifier stage comprising:

an input for receiving an RF signal;

an output adapted to connect said preamplifier stage to a super-regenerative circuit; and a cascode circuit connected to said input, said cascode circuit including a field effect transistor (FET) and a bipolar transistor connecting said FET to said output, said FET and said bipolar transistor cooperating to produce low gain in a direction from said output to said input to thereby decrease RF radiation emitted from a super-regenerative circuit connected to said output.

22. A preamplifier stage as claimed in claim 21, including resistive loading means connected to said FET and said bipolar transistor for increasing stability in said cascode circuit.

23. A preamplifier stage as claimed in claim 22, wherein said cascode circuit further comprises phase shifting means connected between said FET and said bipolar transistor, and said resistive loading means is connected in parallel with said phase shifting means, said resistive loading means cooperating with said phase shifting means to phase shift a RF signal amplified by said cascode circuit.

24. A preamplifier stage as claimed in claim 23, wherein said phase shifting means includes inductive means, and said resistive loading means includes a capacitive means and a resistive means connecting said capacitive means to said inductive means.

25. A preamplifier stage as claimed in claim 24, wherein said inductive means is an inductor that connects the drain of said FET to the emitter leg of said bipolar transistor, said capacitive means is a capacitor, said resistive means is a resistor that connects said capacitor to a connective point between said inductor and said emitter leg, and said bipolar transistor is connected in common base configuration.

26. A preamplifier stage as claimed in claim 24, further comprising large value coupling capacitance means connecting the collector leg of said bipolar transistor to said output.

27. A preamplifier stage as claimed in claim 26, wherein said coupling capacitance means has capacitive value of about 33 pF.

28. A preamplifier stage as claimed in claim 26, including a gain network connected to said collector of said bipolar transistor, said gain network including a parallel connection of a resistor having a value of about 200 Ω and a capacitor.

29. A preamplifier stage as claimed in claim 21, wherein said FET is a dual gate FET having a first gate and a second gate, said cascode circuit includes a DC gain control circuit for said FET, and said first gate is connected to an input of said cascode circuit, and said second gate is connected to said DC gain control circuit.

30. A method of signal amplification in a super-regenerative receiver for use in an electrical door opener, said method comprising the steps of:

providing a super-regenerative circuit with an input and an output;

providing a cascode preamplifier stage upstream of said super-regenerative circuit, said cascode preamplifier stage including an input for receiving a RF signal, an output for coupling said preamplifier stage to said input of said super-regenerative circuit, a field effect transistor (FET), and a bipolar transistor connecting said FET to said output of said cascode preamplifier stage;

resistively loading said FET and said bipolar transistor to increase stability in said preamplifier stage;

phase shifting a RF signal applied to said input of said preamplifier stage; and providing low impedance coupling means between said input of said super-regenerative circuit and said output of said preamplifier stage.

* * * * *